US 6,673,638 B1

(12) United States Patent
Bendik et al.

(10) Patent No.: US 6,673,638 B1
(45) Date of Patent: Jan. 6, 2004

(54) METHOD AND APPARATUS FOR THE PRODUCTION OF PROCESS SENSITIVE LITHOGRAPHIC FEATURES

(75) Inventors: Joseph J. Bendik, Escondido, CA (US); Matt Hankinson, San Jose, CA (US)

(73) Assignee: KLA-Tencor Corporation, San Jose, CA (US)

( * ) Notice: Subject to any disclaimer, the term of this patent is extended or adjusted under 35 U.S.C. 154(b) by 18 days.

(21) Appl. No.: 10/058,572

(22) Filed: Jan. 28, 2002

Related U.S. Application Data
(60) Provisional application No. 60/335,712, filed on Nov. 14, 2001.

(51) Int. Cl.[7] .............................................. H01L 21/66
(52) U.S. Cl. ........................................... 438/14; 438/15
(58) Field of Search ............................. 438/5–7, 14–18, 438/800; 716/4

(56) References Cited

U.S. PATENT DOCUMENTS

| | | | | | |
|---|---|---|---|---|---|
| 4,855,253 A | * | 8/1989 | Weber | ........................ | 324/537 |
| 5,103,557 A | * | 4/1992 | Leedy | ..................... | 29/407.01 |
| 5,827,623 A | * | 10/1998 | Ishida et al. | ................... | 430/5 |
| 5,970,311 A | * | 10/1999 | Cheek et al. | ............... | 324/765 |
| 5,976,740 A | | 11/1999 | Ausschnitt et al. | ........... | 430/30 |
| 6,120,953 A | * | 9/2000 | Lin | ............................. | 430/296 |
| 6,143,579 A | * | 11/2000 | Chang et al. | ................. | 438/14 |
| 6,174,630 B1 | * | 1/2001 | Petranovic et al. | ........... | 430/30 |
| 6,174,741 B1 | * | 1/2001 | Hansch et al. | ................. | 430/30 |
| 6,294,397 B1 | * | 9/2001 | Jarvis et al. | ................... | 438/11 |
| 6,345,210 B1 | * | 2/2002 | Yu | ................................ | 430/5 |
| 6,365,422 B1 | * | 4/2002 | Hewett et al. | .............. | 257/355 |
| 6,374,396 B1 | * | 4/2002 | Baggenstoss et al. | .......... | 430/5 |
| 6,425,117 B1 | * | 7/2002 | Pasch et al. | .................. | 430/5 |
| 6,433,878 B1 | * | 8/2002 | Niu et al. | ................... | 356/392 |
| 6,444,373 B1 | * | 9/2002 | Subramanian et al. | ........ | 430/5 |
| 6,448,099 B1 | * | 9/2002 | Iacoponi et al. | .............. | 438/14 |
| 6,458,605 B1 | * | 10/2002 | Stirton | ........................... | 438/7 |

OTHER PUBLICATIONS

Ausschnitt et al., Process window metrology, IBN Semiconductor Research and Development Center, Proc. *SPIE* 3999, Feb. 29, 2000, pp 1–9.

\* cited by examiner

Primary Examiner—John E. Niebling
Assistant Examiner—Olivia Luk
(74) Attorney, Agent, or Firm—Beyer Weaver & Thomas, LLP

(57) ABSTRACT

A method for controlling the variation in process parameters using test structures sensitized to process parameter changes. Wavefront engineering techniques are used to make features of the test structure more sensitive to process changes. Focus and exposure parameters are adjusted in response to the measurements of the test structures. In another embodiment, the wavefront engineering features are placed to permit the test structure appearing on the reticle out of focus. The wavefront engineering feature is an OPC technique applied to the test structure to modify it. The OPC features are applied in an asymmetrical manner to the test structure and enable identifying the direction of process focus changes.

14 Claims, 9 Drawing Sheets

METHOD AND APPARATUS FOR THE PRODUCTION OF PROCESS SENSITIVE LITHOGRAPHIC FEATURES

CROSS-REFERENCE TO RELATED APPLICATION

This application takes priority under U.S.C. 119(e) of U.S. Provisional Application No.: 60/335,712 filed Nov. 14, 2001 entitled, "METHOD AND APPARATUS FOR THE PRODUCTION OF PROCESS SENSITIVE LITHOGRAPHIC FEATURES" by Joseph J. Bendik and Matt Hanksinson, which is incorporated by reference in its entirety for all purposes.

BACKGROUND OF THE INVENTION

The present invention relates generally to producing process adjustably sensitive lithographic features on semiconductor wafers. More particularly, the present invention provides apparatus and methods using wavefront engineering to produce targets on semiconductor wafers which are sensitive to focus and dosage variations in equipment effectuating the printing of layers on wafers.

Designers and semiconductor device manufacturers constantly strive to develop smaller devices from wafers, recognizing that circuits with smaller features generally produce greater speeds and increased yield (numbers of usable chips produced from a standard semiconductor wafer). It is desirable to produce wafers with consistent dimensions, particularly as to the line widths printed on the devices. However, with smaller devices (where the critical dimension of the printed features are smaller than the exposure wavelength) the difficulty in meeting critical dimension tolerances increases. Certain wave front engineering techniques such as optical proximity correction (OPC) and phase shift mask (PSM) techniques are often applied to reticles to improve lithographic performance and extend the useful lifetime of optical exposure tools. The changes produced by these techniques are referred to as wavefront engineering features. Phase shift mask (PSM) techniques (strong-alternating, weak-embedded, and attenuating) are used mainly to improve lithographic resolution, improve depth of focus, and monitor the lithographic stepper or scanner performance using focus monitors. Optical proximity correction is a wavefront engineering technique wherein a modification of the photomask pattern (binary changes, i.e., adding or subtracting chrome on the mask) is made to compensate for changes in feature shape and size that occur during pattern transfer from the mask to the wafer. These feature changes may be caused by extra exposure due to the presence of adjacent lithographic features, a limitation in the wafer stepper/scanner, or a variation in the activity of a given wafer process step. OPC is also used on phase shifted masks to maximize the benefit gained from PSM technology. While OPC techniques are often used to correct for pattern fidelity error (a reduction in the quality of the aerial image) and improve process latitudes, OPC does little for improving resolution. In addition to OPC and PSM technologies, a variety of other wavefront engineering techniques are currently in use. For example, sub-resolution features called-"scatter bars" (binary mask additions or sub-resolution mask patterns which do not print) improve lithographic behavior of small isolated and quasi-dense features by adjusting the shape of the aerial image—simply an extension of OPC technology.

Minor variations in process parameters, such as changes in focus and exposure dose on photolithographic exposure equipment (scanners/steppers), may cause the critical dimensions (CD) on the wafers to fall outside acceptable semiconductor manufacturing tolerances (typical CD specifications are +/−8%). A large number of process parameters may affect the dimensions of a resist pattern on a silicon wafer. Some of the most significant parameters include: resist thickness, focus position, exposure dose, resist pre and post bake temperatures and development temperature and time. While photolithographic exposure tools and photolithographic resist tracks continuously monitor and adjust for small fluctuating changes in the process conditions (bake times, exposure dose, focus, etc.,) the resulting resist feature size or critical dimension is a complex result of all process variables. Typically, semiconductor manufacturing facilities correct for process variation (drifting CD's) by adjusting only the exposure dose (e.g. hourly changes). This tends to provide the most economically viable solution.

Photolithography is one of the most important steps of the semiconductor manufacturing process. During the photolithographic process a semiconductor wafer is coated with a light sensitive material called a photoresist or resist (example; chemically amplified resist (CAR)) and is exposed with an actinic light source (excimer laser, mercury lamp, etc.,). The exposure light passes through a photomask and is imaged via projection optics onto the resist coated wafer forming a reduced image (typically 4× or 5× smaller) of the photomask in the photoresist. For positive chemically amplified resists (CARs) the actinic light source typically causes the production of photoacids that diffuse during post exposure bake and allow the resist to be rinsed away by an aqueous developer only in those regions receiving most of the exposure dose. Following the develop process the resist patterned wafers are sent to a metrology station to measure the critical dimensions or shape of the patterned resist features. Typical metrology tools include scatterometers, scanning electron microscopes and atomic force microscopes. The last step in the photolithographic process involves etching the resist-coated wafers using complex plasma chemistry to attack the semiconductor material not covered with photoresist.

Following etch, the resist coated wafers are cleaned and sent to a scanning electron microscope or other metrology for final lithographic inspection. Precise control of the printing process is necessary to ensure that the device line widths forming the pattern on the wafer fall within tolerance. Prior to etching, it is possible to repeat the lithographic processing if a problem is detected in time. After the photoresist wafers are physically etched it is too late to correct the photolithographic imaging process. Presently, one monitoring technique used is a lot sampling of the resist imaged wafers to determine if the line widths (critical dimensions) have fallen outside an acceptable range prior to etch. However, given the extremely small sizes of the devices, for example device sizes of 0.15 micron or smaller, expensive and slow metrology techniques are necessary. With these dimensions, one of the few effective tools currently in use to measure line widths is a scanning electron microscope (SEM). The wafers must be removed from their processing location and transported to the SEM. Moreover, the time required for SEM inspections is so extensive that a typical sampling rate may not detect a process drift until after a large number of wafers have been etched.

Other monitoring metrologies include; scatterometry techniques (ellipsometry, variable angle, reflection) using complex and expensive look-up libraries, and optical CD techniques utilizing an inexpensive optical metrology tool and dual toned line shortening ("schnitzl") arrays to indirectly measure the critical dimensions of photoresist patterned wafers using line-end shortening techniques. While the OCD technique is fast and inexpensive the technique may or may not have the optimum process sensitivity that is required for day to day production monitoring routines. In practice the OCD technique can be used to determine both focus and exposure drifts by building a second order polynominal description of the complex CD drift with changes in focus and exposure. However, the ability to determine absolute direction of focus drifts requires the additional printing of test fields out of focus—which takes valuable exposure time and space on a semiconductor wafer.

What is needed is a quick and inexpensive method of detecting variations in the semiconductor process using optical metrology techniques that have adjustable levels of process sensitivity and are capable of predicting the direction of focus drifts.

SUMMARY OF THE INVENTION

To achieve the foregoing, and in accordance with the purpose of the present invention, a method for monitoring and controlling the photolithographic process parameters in a more versatile and effective way is described.

The present invention provides a method for controlling the variation in process parameters using modified target structures that have an adjustable degree of process sensitivity and can be used to determine the absolute direction of focus drifts. Optical proximity corrections and/or PSM techniques are used to modify mask level dual tone paired line shortening test structures (e.g. "schnitzl arrays") to customize the CD vs. focus and exposure process sensitivity. The modified schnitzel array test structures are printed at selected locations on the wafer and used to monitor the semiconductor lithography process. If the process has changed, focus and exposure parameters can then be adjusted in response to the measurements of the test structures.

In one aspect, the method for controlling semiconductor process parameters comprises forming a pattern having a test structure on a reticle and adjusting the sensitivity of the test structure to lithographic process changes by using wavefront engineering features applied to modify the test structure.

In another aspect optical proximity corrections or phase shift mask features are placed to modify a test structure capable of distinguishing focus and exposure process changes. The wavefront engineering features permit the sensitivity of the target structure to be adjusted. The sensitivity is used to monitor the process, i.e. to determine whether the focus or dose of the photolithography tool has changed.

In another aspect, the wavefront engineering techniques are OPC features placed in an asymmetrical manner to permit a determination as to the direction and magnitude of the process focus changes.

These and other features and advantages of the present invention will be presented in more detail in the following specification of the invention and the accompanying figures, which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF SPECIFIC EMBODIMENTS

Reference will now be made in detail to specific embodiments of the invention. Examples of these embodiments are illustrated in the accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
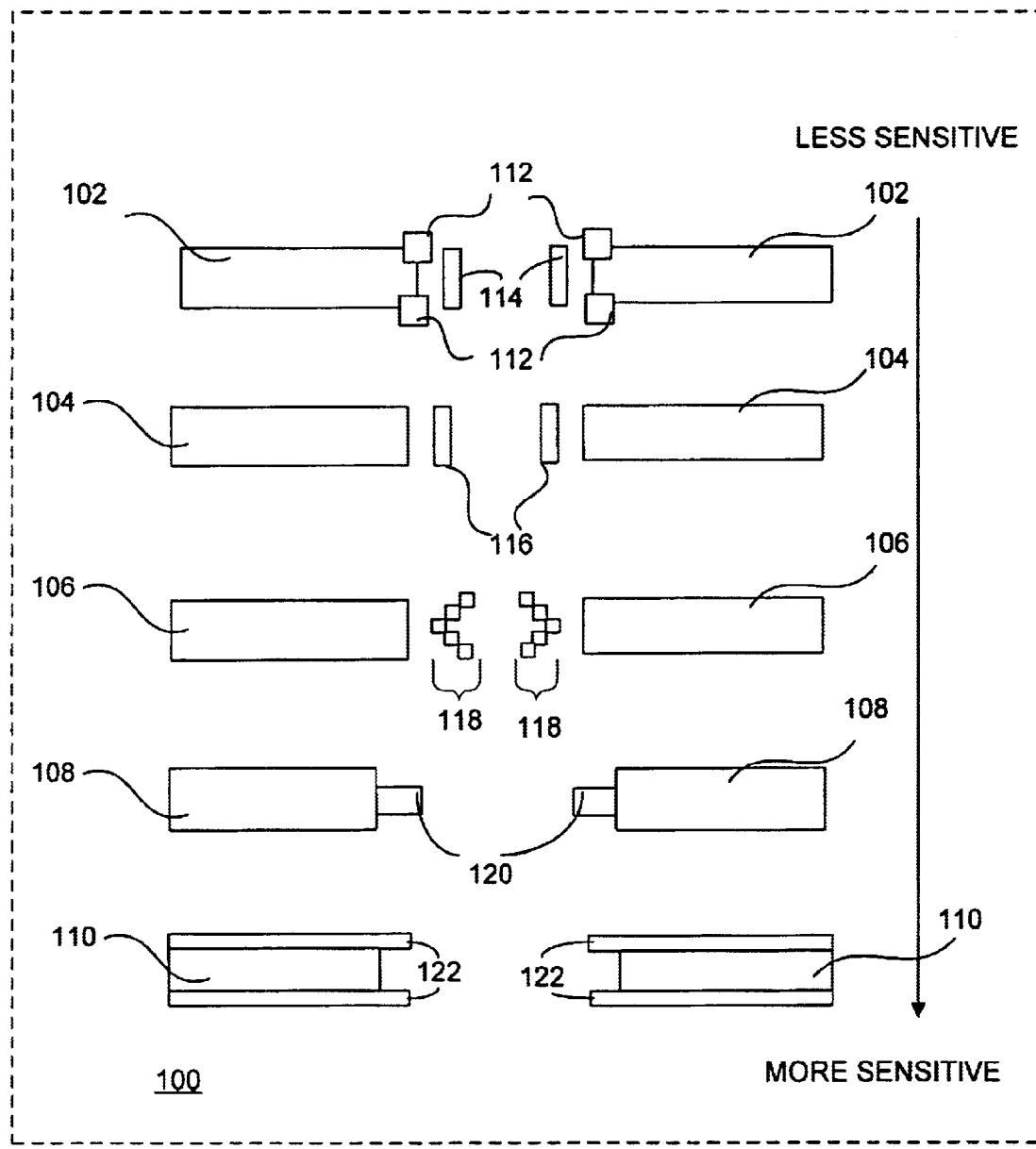
FIG. 1 is a diagrammatic representation of a reticle using subresolution features.

FIG. 1 is a diagrammatic representation of the use of various wavefront engineering techniques in the form of binary changes on the pattern appearing on a reticle. These changes control the dimensions of the pattern printed on the wafer. FIG. 1 illustrates an OPC corrected array 100 on a reticle having test structure features 102, 104, 106, 108, and 110 making up the array 100. Serifs 112 are shown added to test structure features 102 to reduce corner rounding and feature length shortening on the printed pattern. Serifs 112 are examples of subresolution assisting features, i.e., features appearing on the reticle which help control the printing of the test structure features onto the printed wafer but do not themselves appear in the printed test structure. Other examples of subresolution assisting features shown in FIG. 1 include scattering bars 114, 116, and 118 as well as line jogs 120 and 122.

Sub resolution assisting features 112–122 as shown in FIG. 1 may be arranged to control line end shortening effects on the printed wafer. The amount of line end shortening will be sensitive to changes in process parameters. Any suitable subresolution features may be used to control line end shortening effects due to process changes. Wavefront engineering techniques employ various forms of subresolution assisting features including, for example, scattering bars, hammerheads, and serifs.

Wavefront engineering technology creates more process latitude to improve the process window of the lithographic processes. This flexibility enables the printed shapes to be kept within tight tolerances. The subresolution features employ well-known principles of wavefront correction to achieve this result and may be used in both binary masks and phase shifted masks. In binary masks the patterns created by the opaque portions (typically chrome) and the clear portions of the reticle are used to produce the pattern on the exposed wafer using a variety of techniques. Phase shift masks additionally manipulate the phase of the incoming exposure beam to locate the patterns on the wafer. Reticles may be produced according to techniques well known to those of skill in the art.

In most typical applications, the sub resolution features are placed next to primary pattern features (i.e. lines part of the circuit desired to be printed on the wafer) and are used to decrease the sensitivity of the wafer features to changes in process control, such as drift in the focus or dosage in the exposure tool of the lithographic process. This is often desired so that the circuit patterns are consistently printed even when the process drifts. Otherwise, changes in the line lengths may affect the circuit adversely. For example, contacts may no longer align properly with a particular conductive line that has shrunk in length.

Product specifications commonly provide an acceptable range or tolerance for the device dimensions such as line width. In order to ensure compliance for the extremely small dimensions used, expensive and time consuming inspection measures have conventionally been employed. For example, a sampling of finished wafers is subjected to inspection by scanning electron microscopes (SEM). Although SEM measurements are used in the initial setup of the lithographic process, a post-patterning SEM sampling inspection has been necessary in conventional processes to ensure that the critical dimensions remain within acceptable limits. The critical dimensions may change due to changes in the process.

Though on its face increased sensitivity is undesirable in the patterned wafer, it may be advantageously used to monitor the drift of the focus and dose parameters during production. Although changes in process parameters, i.e. changes in the "process window", affect the printed pattern to some degree, in many cases the shift in position in the process window produces only minor changes in device critical dimensions. To address this problem, i.e. to better enable monitoring of process changes, specialized target structures (e.g., test structures) such as including dual tone line end shortening arrays have conventionally been placed on reticles for printing in inconspicuous locations on the wafers. These line shortening arrays are more sensitive to process parameter changes and permit the line shortening to be detected using optical metrology tools. However, certain variations in the process window may not be easily detected using even these line end shortening arrays and optical tools. For example, the process window may primarily be characterized as combinations of focus and dose. Although test structures such as dual tone arrays may be sensitive to major variations from a process window, a minor excursion from the initially selected focus and dose level, e.g. a + or − change in focus in the range of a few nm, may not be detectable using optical metrology as applied to dual tone line end shortening arrays. Placement of wavefront engineering features in the vicinity of the dual tone arrays will, in one embodiment, make the dual tone arrays or other target structures sensitive to even minor process changes in that portion of the process window and thus detectable using optical metrology tools.

The present invention provides a method using adjustably sensitive test targets for directly monitoring the changes in the process which may also adversely affect critical dimensions. The test targets may be measured to monitor the process using an optical or an SEM tool using a process sensitive target correlated to the wafer features. Since the process is controlled, critical dimensions are also ideally indirectly controlled. Accordingly, the critical dimensions may not have to be independently verified after fabrication.

Figure 2B:
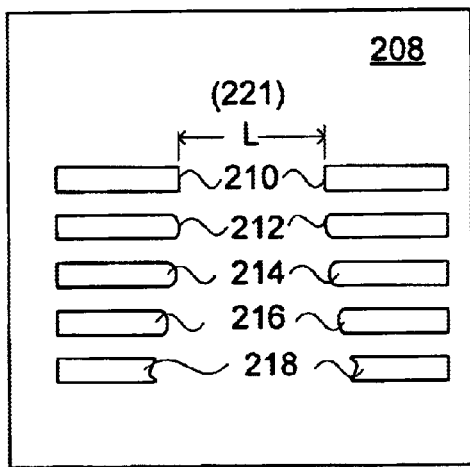
FIG. 2B is an enlarged diagram of the pattern illustrated in FIG. 2A.
Figure 2A:
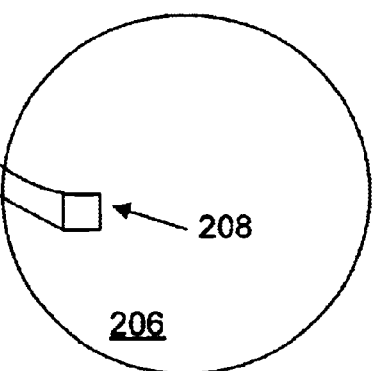
FIG. 2A is a diagrammatic representation of a pattern on a die produced using the reticle of FIG. 1.

As noted earlier, the OPC and PSM features are typically used to make patterned lines of the circuit on the printed wafer less sensitive to changes in lithographic process parameters such as focus and dosage. However, through proper selection of OPC and PSM features (e.g., their size, design, and placement), the patterned device lines may be made with a range of sensitivities to the focus and dose variations in the process. That is, the OPC and PSM features can be configured so that focus and dose variations produce a desirable or controllable range of line end shortening, thus providing better monitoring of process variations and thereby enabling better process control. Using embodiments of the present invention, a test target or arrays of test targets that utilize line end shortening techniques and OPC or PSM features may be designed to have a maximum sensitivity to changes in process. Since the test target is not part of the functioning circuit, the increased responsiveness to process changes will not adversely affect functioning of the circuit. The amount of line end shortening may be adjusted using wavefront engineering techniques FIG. 1 and FIGS. 2A–2B further illustrate wavefront engineering techniques employed to produce adjustably sensitive printed lithographic features on the wafer in accordance with embodiments of the present invention. The array embodied by test structure features 102–110 in FIG. 1 range from the less sensitive test structure features (102 in conjunction with 112 and 114) to the more sensitive test structure features (110 in conjunction with 122). FIGS. 2A–2B illustrates this range of sensitivities in a patterned wafer 206 having a die 208 formed using the array 100 from the reticle shown in FIG. 1. Subresolution features 112–122 which appeared on the reticle of FIG. 1 do not appear in the printed pattern featured in FIG. 2A or the illustrated enlargement of the printed pattern shown in FIG. 2B, but their impacts on the printed wafer pattern are discernible. Line end shortening is a complex function of physics and chemistry of the lithography process. When used with a test structure comprising an array, line end shortening is typically measured between two rows of features making up the array, such as by the distance 221 (L). Printed lines 210 show minimal line end shortening whereas lines 212 to 218 show progressively greater line end shortening.

The sensitivity of line end shortening target arrays varies with the configuration and design of the optical proximity and phase shift mask correction. More specifically, the variation in selected line end shortening target dimensions in response to process variations varies with the design of the wavefront engineering features. The shift in position in the process window in production wafers may occur across the wafer or between wafers. In sum, an indirect measure of the drift in process parameters is provided by the changes in geometry of the line end shortening target arrays.

Initially, simulations may be run to determine design of the wavefront engineering features to produce the desired sensitivity of dimensions (lengths) in the test target patterns. Alternatively, the optimum design of the wavefront engineering features may be determined by using the stepper machine to expose a matrix of line end shortening target arrays at different focus and exposure combinations using a reticle with a matrix of wavefront engineering features having various sizes, designs, and locations relative to the line end shortening target arrays.

Figure 3:
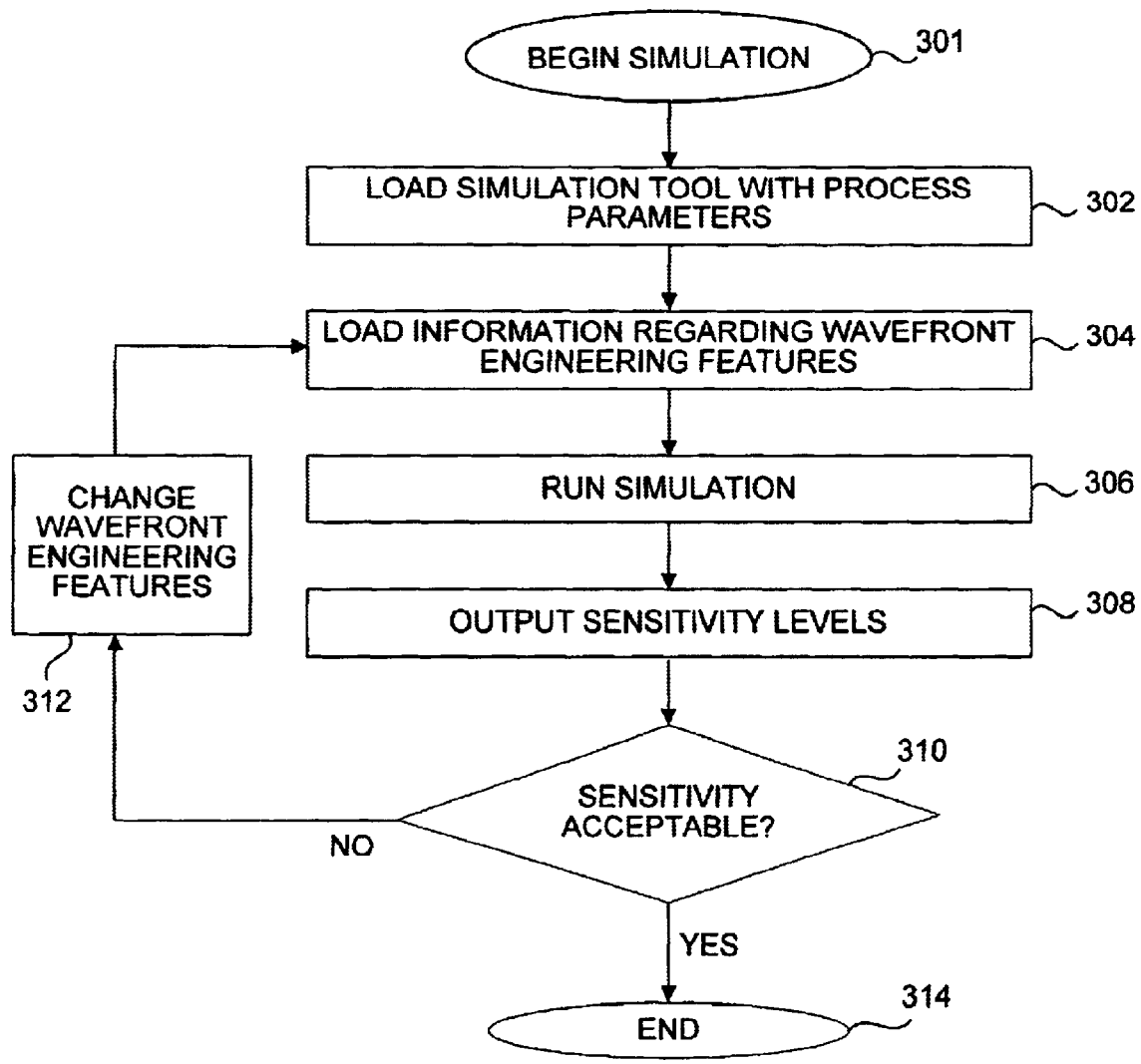
FIG. 3 is a flowchart of method to determine the size and location of subresolution features in accordance with one embodiment of the present invention.

Simulations may be run on a commercial simulation tool such as the ProLith tool manufactured and sold by KLA-Tencor of San Jose, Calif. Other comparable products are available to simulate variations in critical dimensions caused by changes in process parameters and different wavefront engineering feature arrangements. FIG. 3 is a flowchart illustrating a design process for configuring and sizing the subresolution assistance features in accordance with one embodiment of the present invention. Initially, the selected setting for the photolithography tool may be inputted into the simulation tool. These settings may indicate focus, dose, and a number of other process parameters such as stepper settings and various resist parameters (302) that may affect a target structure's printed dimensions. An initial design setting for the size and configuration of the subresolution assistance features is then entered into the simulator (304). Alternatively, a plurality of different wavefront engineering feature configurations may be entered. The initial settings may be estimated in accordance with the skill and experience of the individuals operating the photolithography simulation tools.

The initial settings are then run on the simulation tool to ascertain sensitivity levels of the resulting printed test structure to changes in focus and dosage levels. The simulation tool will calculate changes in critical dimensions (e.g., line end shortening) on the target corresponding to drifts in both the dose and focus of the exposure tool. Different sensitivities are illustrated and later described with reference to FIG. 4. For example, if the inspection tool is relatively insensitive to the changes in dimensions caused by process parameter variations, a target structure that exhibits greater sensitivity to process changes may be selected. Optical inspection tools are generally incapable of directly measuring the line widths prevalent in integrated circuits currently being fabricated. Thus, test structures such as dual tone arrays printed in conjunction with the wavefront engineering techniques as described in the present invention provide the adjustably sensitive lithographic features which may be measured using optical techniques. An optical inspection tool such as KLA-Tencor's 5300 Optical Overlay tool may be configured to perform the process monitoring if a target structure of increased sensitivity is selected. SEM tools may also be used though they have several drawbacks such as increased expense and time involved in monitoring.

Figure 4:
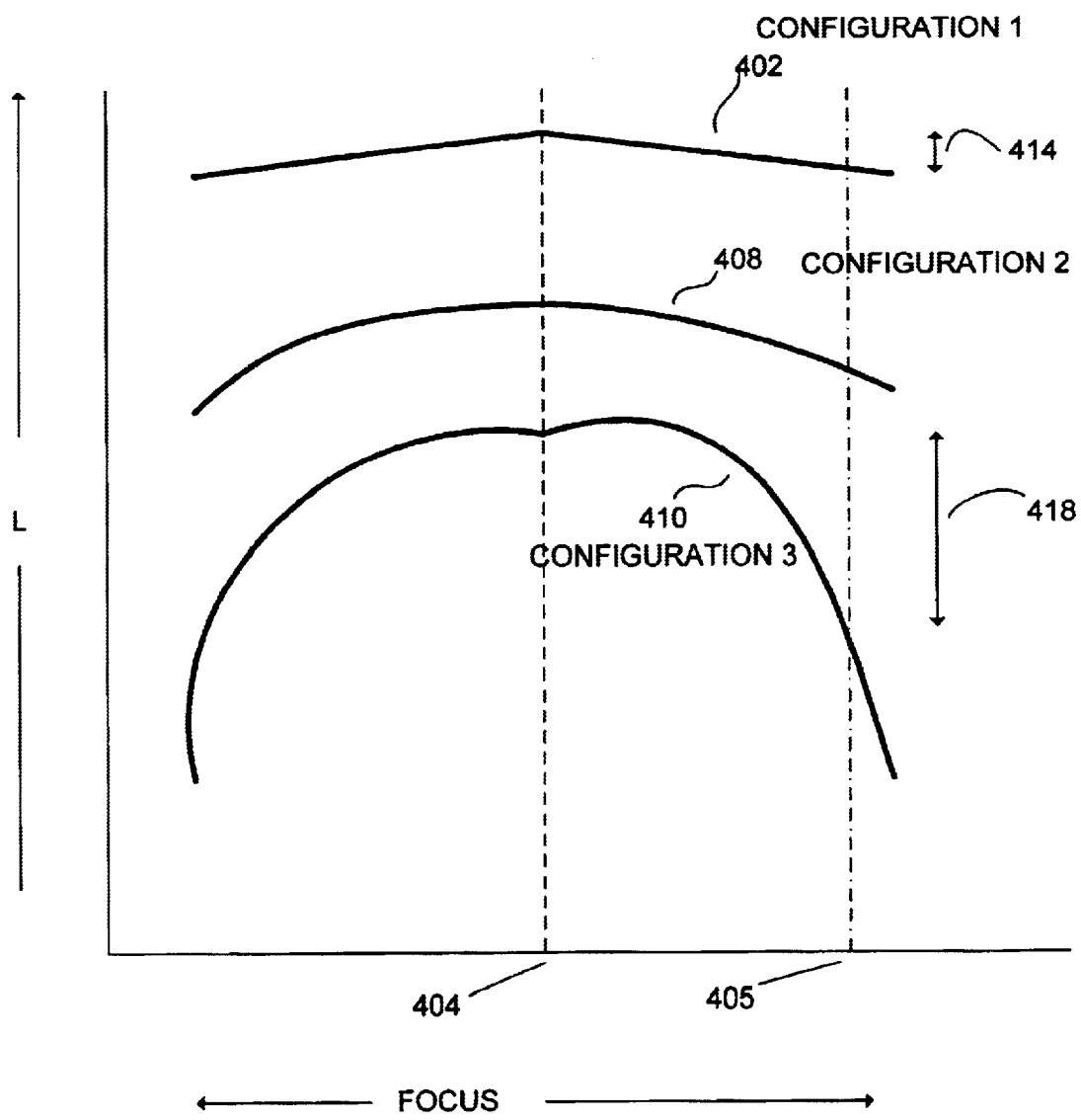
FIG. 4 is an example plot of the sensitivities of configurations of subresolution features in accordance with one embodiment of the present invention.

Continuing with FIG. 3, the simulation tool is then run in order to obtain a simulated result showing the sensitivity produced by the design of the OPC features or other wavefront engineering technique (306). As described below, the wavefront engineering design may incorporate phase shift mask features in addition to, or in lieu of, OPC features. The simulation tool will in one embodiment output the results in the form of a two-dimensional or three-dimensional graph (308). An exemplary graph showing critical dimension L changes vs. focus changes is shown in FIG. 4 and described below. A determination is then made as to whether the sensitivity corresponding to the wavefront engineering design is satisfactory (310). In one embodiment this is performed by observation using the empirical results but may also use statistical fit methods. For example, it may determine whether the identified changes in focus and/or dose result in corresponding measurable changes within the target structure's critical dimensions. The wavefront engineering design may then be changed in preparation for another simulation run (312). Those skilled in the art would be able to experimentally determine optimal sensitivities based on wavefront engineering design changes such as those made to the configuration and size of the subresolution assistance features on the reticle. Steps 304–312 may be repeated until a desired sensitivity result is produced in the simulation. Although the simulation method is preferred, a suitable wavefront engineering design may also be determined experimentally.

In order to effectuate process control, the target(s) reflecting the desired sensitivity may be integrated into the product reticle with the selected wavefront engineering design, such as the sizes, designs, and configurations of subresolution features. One suitable location corresponds to the scribe lines which run between the wafer dies.

As shown in FIG. 4, the plot of the critical dimension vs. focus illustrates the manner in which sensitivity varies according to the target configurations. For example, the curve 402 representing subresolution feature configuration 1 shows a low sensitivity to changes in focus. When the focus changed from point 404 ("best focus") to point 405 ("defocus"), the resulting critical dimension or length (e.g. line end shortening) changes by an amount 414. A second subresolution feature configuration for the target on the reticle (shown by plot 408) and a third configuration (shown by plot 410) both show greater sensitivities to focus variations. As shown by plot 410, the critical dimension L responds to the focus variation ("defocusing") from point 404 to point 405 by a change in length of 418, which is much greater than length change 414. Thus, configuration 3 shows a much greater sensitivity to change in focus than configuration 1.

Although the above mentioned techniques have been described in the context of binary masks, wavefront engineering techniques using phase shift masks may alternately be employed. Phase shift masks are typically used to improve the resolution of a given wafer stepper exposure tool. An alternating phase shift mask may have an etched clear region between the opaque regions on the reticle. This etched region produces a half-wave phase shift at the wave stepper wavelength. This is an example of a "strong" phase shift mask (PSM) technology and can improve the resolution of the wafer stepper considerably. Another PSM structure providing less improvement in resolution but easier to fabricate is the embedded PSM mask. The embedded PSM comprises a two-layer structure having a transparent film with a phase shift of 180 deg. covered with an attenuating film providing a transmission of 5% to 10%, all deposited on a substrate. These phase shift mask techniques may be used in conjunction with test structures such as the dual toned array and adjusted to provide printed lithographic features on the wafer having a desired sensitivity to process changes.

The resulting wavefront engineering configuration design (e.g., employing either PSM or OPC techniques) may then be verified using the reticle created with the assistance of the simulation tool or experimental results and using a focus-exposure matrix. This test wafer, which is also known as an FEM wafer, may also be used periodically during production to recalibrate the system. A matrix of exposures is run using the test reticle containing the test structure modified by the selected wavefront engineering features. The exposure fields are shot over a range of focus and exposure settings and the amount of line end shortening at these settings is measured. These measurements may then be used to adjust the process line-end shortening model.

Figure 5:
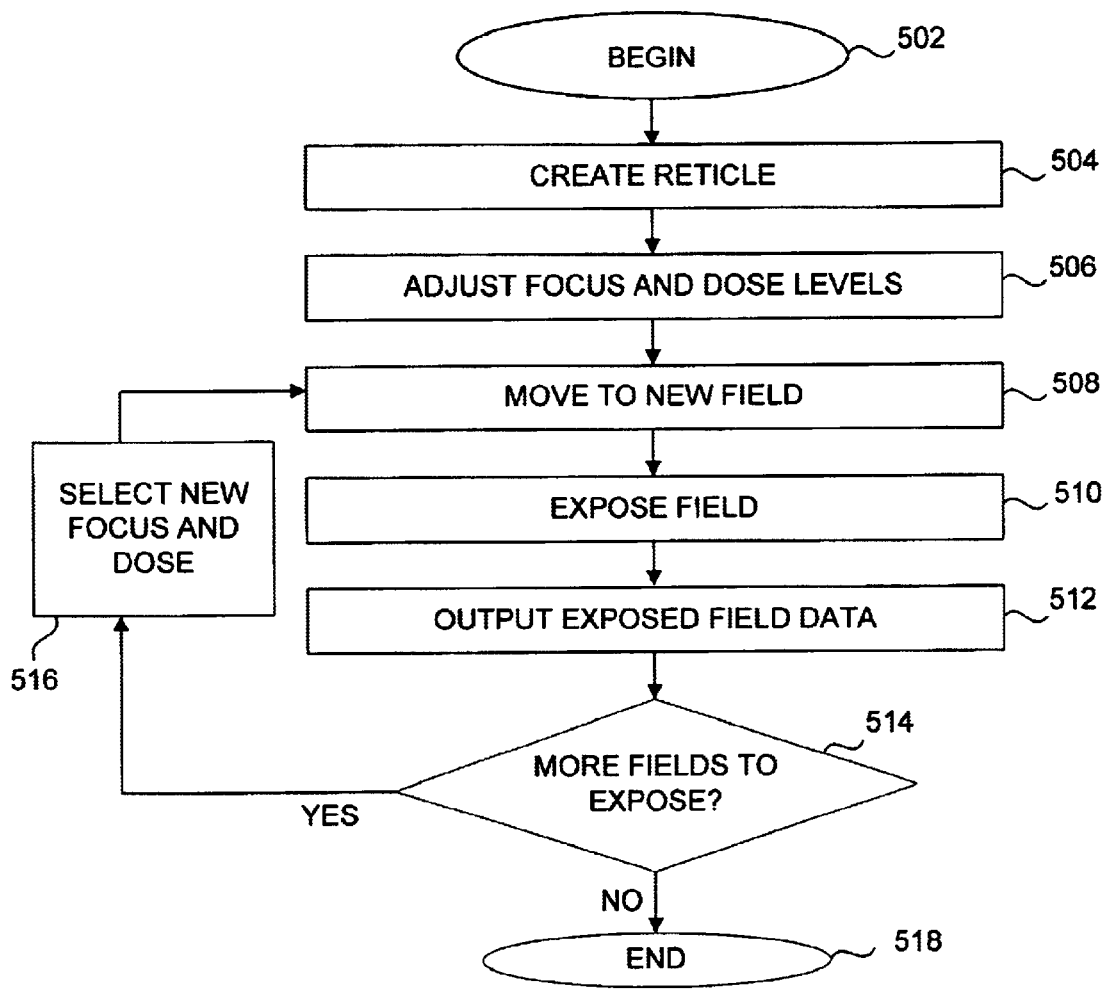
FIG. 5 is a flowchart illustrating a method of calibrating target structures in accordance with one embodiment of the present invention.

As illustrated in FIG. 5, a reticle having the desired test structure with the desired design of wavefront engineering features is initially created (504). Then the focus and exposure settings of the exposure tool are adjusted to the initial settings in accordance with the process parameters selected (506). The stepper machine then moves the reticle and exposure beam to a new field on the wafer, which initially corresponds to the initial field selected (508). The field at this location on the wafer is then exposed (510). This initial focus and exposure setting may be used as a reference in evaluating the effects of process parameter variations on critical dimensions on the test structures.

The result of the exposure is a printed test structure on the wafer. The output may be in the form of an optical measurement of a selected line on a test structure to determine the amount of line end shortening (512). In other embodiments, the output may be an optical image forwarded to image processing software for image comparison and analysis purposes.

A determination follows as to whether other field exposures should be processed (514). If further fields need to be exposed, a new focus-exposure combination is selected (516). At a minimum, the focus and exposure settings which result in an acceptable range of critical dimensions in the device should be evaluated in the created matrix. Steps 508–516 may be repeated until the fields corresponding to the exposure-focus combinations have been completed.

Data collected in this setup procedure may be used to verify whether the subresolution features result in an optimum sensitivity level. Sensitivity patterns may be selected according to a statistical fit to a model. FEM calibrations are performed to establish the relationship among the optical critical dimensions ("OCD") measured on the test pattern ("test structure") and the chip critical dimensions measured using a SEM.

In one embodiment, OCD measurements are used to determine a mathematical model describing the focus and exposure changes responsive to lithographic process changes. The mathematical model is described more fully in U.S. Pat. No. 5,976,740 entitled "Process for Controlling Exposure Dose or Focus Parameters Using Tone Reversing Pattern", which is incorporated by reference in its entirety.

Once these setup procedures as noted above with reference to FIG. 5 have been completed, the target structure may be used to identify the temporal (wafer to wafer) variations in focus and dose as the product wafers are printed. The techniques are also useful for detecting across the wafer (spatial) variations in dies. Periodic sampling of the wafers may be performed to inspect the targets or alternately each wafer may each be inspected.

The sensitivities available using the methods of the present invention allows the user to inspect each wafer using an optical tool inline, thereby increasing the throughput of the process. Optical tools may be utilized inline and without a time penalty since in many processes an optical overlay tool is already used for alignment verification of different layers immediately after the photolithography process.

Figure 6:
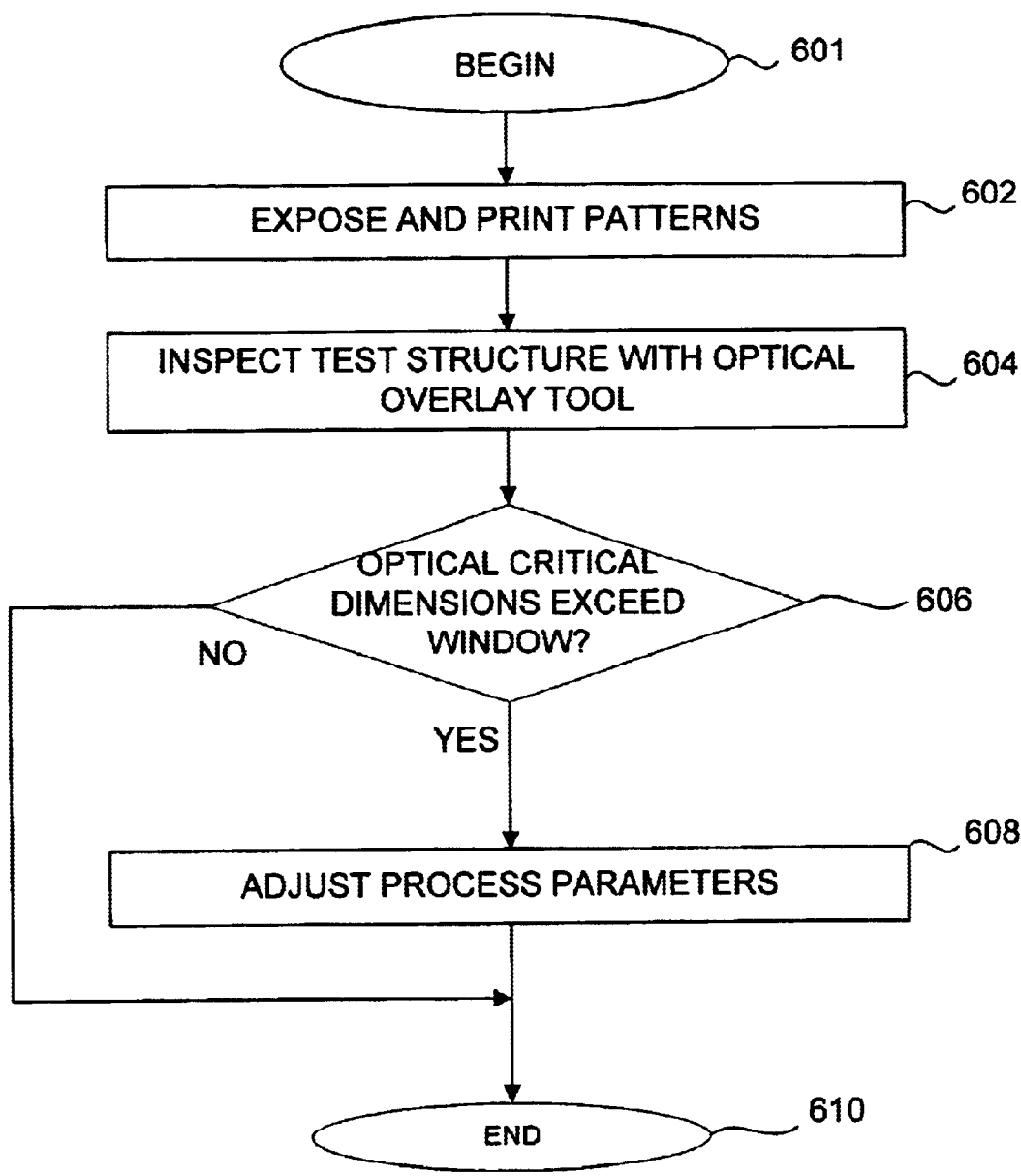
FIG. 6 is a flowchart illustrating an inspection process in accordance with one embodiment of the present invention.

As illustrated in FIG. 6, the optical inspection of the target for process control avoids the SEM inspection step and the time and expense of involved. Initially, the pattern appearing on the glass mask is printed onto the wafer according to methods well known to those of skill in the art (602). The wafer is then placed under the optical overlay tool (or any other suitable critical dimension measurement tool) in order to ascertain changes in the process, i.e. drift in either focus or dose (604). A determination is then made as to whether the measured target feature, as it correlates to the variation in process parameters, exceeds the acceptable range described above with respect to FIG. 5 (606). If the measured feature falls outside the acceptable range, adjustments are made to the process parameters (608). As described above, the boundaries of the acceptable window may be determined using a statistical fit from the optically measured line end shortening. The optical measurement and the corresponding adjustments may be made manually in one embodiment. In other embodiments either the inspection, the adjustment, or the both of them may be performed automatically according to techniques well known to those of skill in the art. If the measured critical dimension falls within the acceptable range, the inspection process for that wafer ends (610) and production of wafers continues without adjustment to the focus or exposure settings.

Some targets may be able to indicate significant variations in the process but may be unable to differentiate between the variations caused by dose and those caused by focus. The techniques of the present invention may be used to full advantage when applied to test structures able to differentiate between process changes caused by either focus or exposure changes. However, the present invention is not intended to be limited to use with such test structures. The wavefront engineering techniques described herein may be applied to test structures able to differentiate process changes caused by only one parameter such as focus or dose or even some other parameter such as resist thickness variation.

Figure 7A:
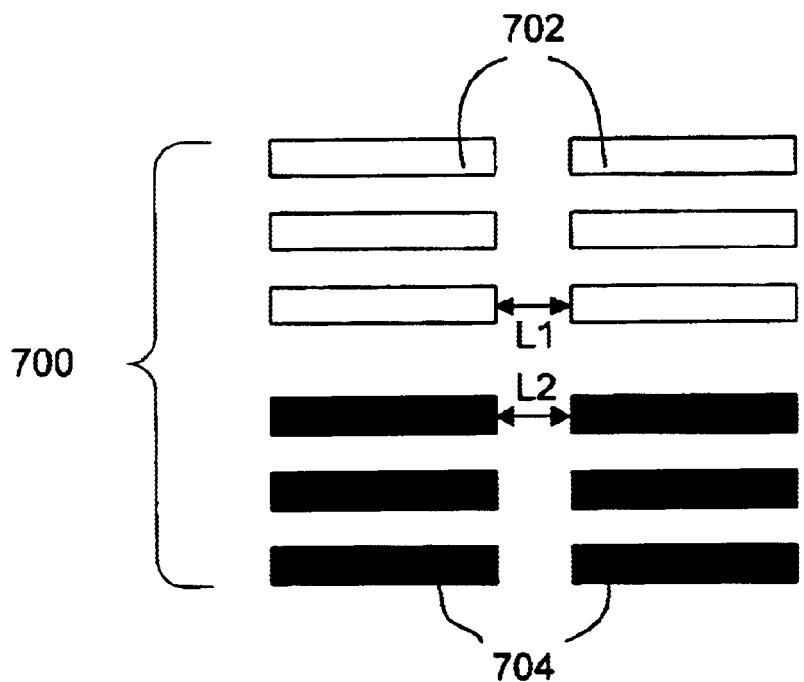
FIGS. 7A and 7B illustrate a target structure and a focus response for the target structures.

One particularly useful class of targets for differentiating between focus and dose changes are the dual tone image-shortening arrays which are also referred to as "schnitzl" targets. These targets comprise a positive tone array coupled with a negative (reverse) tone array. FIG. 7A illustrates a conventional dual toned line shortening array printed at best focus. The dual toned array 700 comprises a positive array 702 and a negative array 704. Although the individual bars are visible in an SEM image, the desirable characteristics of the array may be determined using optical microscopy. The individual bars are not typically visible in optical microscopy but the line ends appear as continuous, optically isolated, high-contrast edges. Line shortening may be measured by the distance such as L1 and L2 between the rows in the target structure 700. Changes in exposure produce changes in the positive tone array which are opposite to the changes in the negative tone array. Changes in focus produce the same changes in the positive as the negative tone array. These characteristics of the dual tone arrays and a set of equations enable measurements from such a test structure to allow differentiation between focus and exposure changes in the lithographic process.

The circuit or device critical dimensions are calibrated with the optical critical dimension measurements using the focus exposure matrix described above. A mathematical model may be created to differentiate between focus and exposure variations and to correlate the focus and exposure variations with measured CD values from a desired feature. The process is first characterized by printing a complementary tone-reversing pattern under a series of different exposure and focus conditions. For each ($E_i$, $Z_j$) combination, the shape ($A_{ij}$) and space ($B_{ij}$) dimensions are measured. Dimensions L1 and L2 as shown in FIG. 7A represent the shape (Aii) and space (Bii) dimensions. The target values ($A_{to}$, Bto) are determined by correlation to the desired dimensions of the circuit pattern. At the optimum focus $Z_0$ determined as the point at which the rate of change of A and B with z is minimum, the target values must correspond to a single value of dose, $E_i$.

The dependence of the shape and space dimensions on dose and focus in the neighborhood of the target values ($A_{to}$, $B_{to}$ and $E_t$, $z_c$) are modeled by a set of parametric equations:

$$\alpha = f(\epsilon, \zeta, a_1, a_2 \ldots)$$
$$\beta = f(\epsilon, \zeta, b_1, b_2 \ldots) \quad (1)$$

where $\alpha$, $\beta$, $\epsilon$ and $\zeta$ are defined as deviations from the target values:

$$\alpha = A - A_{to}, \beta = B - B_{to}, \epsilon = E - E_t \text{ and } \zeta = z - z_0.$$

For examples, the equations:

$$\alpha = a_1 \zeta^2 + a_2 \epsilon$$
$$\beta = b_1 \zeta^2 + b_2 \epsilon \quad (2)$$

are used to capture the case where the exposure dose sensitivity (represented by slope parameters $a_2$, $b_2$) and defocus sensitivity (represented by curvature parameters $a_1$, $b_1$) differ between the shape and space patterns. The parameters ($a_1, a_2, \ldots$) and ($b_1, b_2, \ldots$) may be determined by a conventional least-squares fit to the measured dose-focus data. Once the parameters have been established by fit to the model, the set of equations (1) can be used to solve for the dependence of dose and focus on the shape and space dimensions:

$$\epsilon = g(\alpha, \beta, a_1 \ldots a_n, b_1 \ldots b_n) \quad (3)$$
$$\zeta = h(\alpha, \beta, a_1 \ldots a_n, b_1 \ldots b_n) \quad (4)$$

For the example given by equation (2), equations (3) and (4) can be expressed analytically as:

$$\epsilon = (b_1 \alpha - a_1 \beta)/(a_2 b_2 + a_1 b_2) \quad (5)$$
$$\zeta^2 = (b_2 \alpha + a_2 \beta)/(a_2 b_1 + a_1 b_2) \quad (6)$$

Figure 7B:
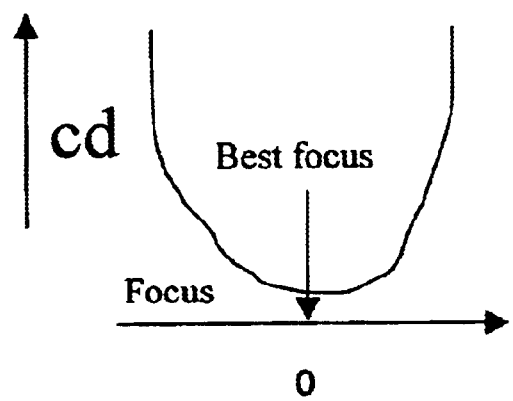

As illustrated in FIG. 7B, the plot of the critical dimension (as measured optically) vs. focus produces a best-fit curve that is symmetrical about the best focus point. As seen from the symmetry of the curve, two solutions exist (i.e., two defocus values) for the critical dimensions determined from the optical measurements of the line shortening array. In order to facilitate a proper adjustment to process parameters, both the magnitude and direction of the drift in focus should be determined.

A number of conventional target structures respond to focus and dose variations but none are capable of distinguishing the direction of focus drift without exposing additional fields. For example, in conjunction with dual-tone paired line shortening arrays, the exposure of two additional fields is described in "From Compliance To Control: Off-roadmap Metrology For Low-k1 Lithography," Proceedings S.P.I.E. 4344-01 (Feb. 26, 2001), incorporated by reference herein in its entirety. The exposure of two additional fields is required in order to expose targets in a defocused condition and thus determine the direction of the focus drift. The present invention, in one embodiment, identifies the direction of the drift in focus by using the placement of binary OPC features to create a defocused pattern and thus without requiring the yield loss from one or more additional field exposures.

The present invention utilizes wavefront engineering techniques to print one or more test structures out of focus in the same exposure field as a test structure printed at best focus. In one embodiment, the present invention uses OPC techniques to print dual tone array (e.g., Schnitzl) targets that will print out of focus in a predetermined direction (+ or − direction). These defocused targets may be printed in the same field using the same focus and exposure settings as the in-focus printed targets. In order to determine the direction of focus drift, OPC techniques are applied to a test structure so that at least one of the test structures prints out of focus. In another embodiment, OPC techniques are employed so that at least two targets print out of focus in the same exposure field as the in-focus test structure.

Figure 8A:
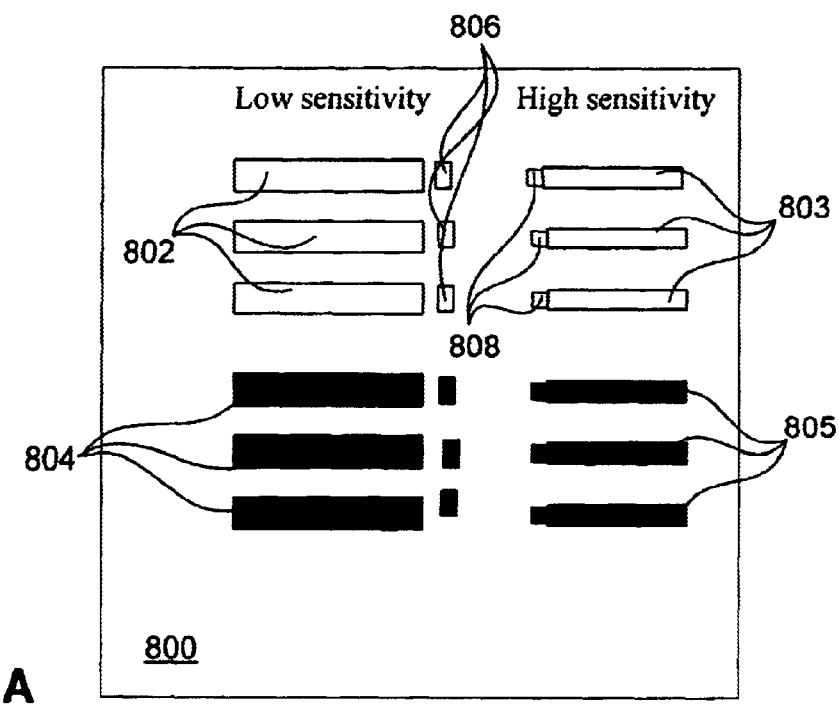
FIGS. 8A and 8B an OPC corrected target structure and a focus response for OPC corrected target structures in accordance with one embodiment of the present invention.
Figure 8B:
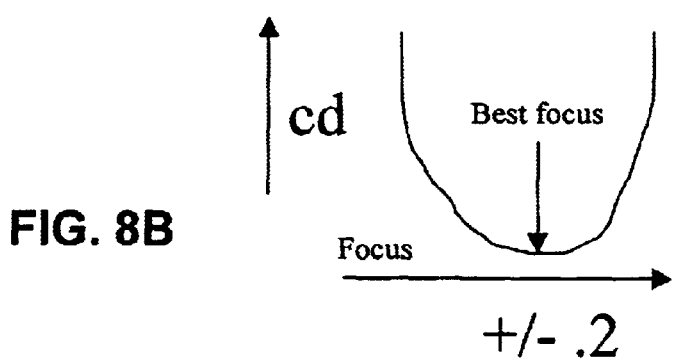
Figure 8C:
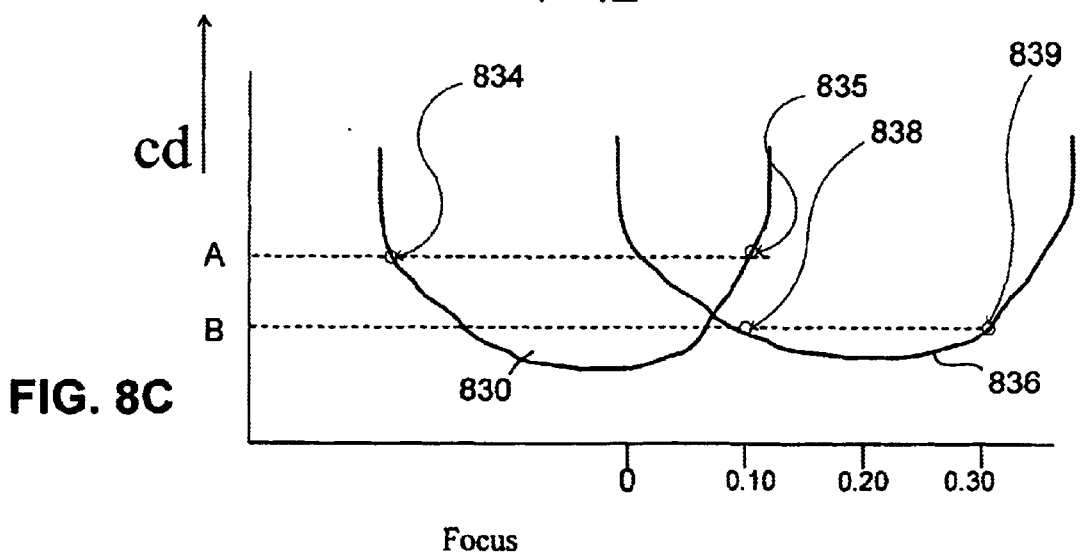
FIG. 8C is a focus response plot illustrating the determination of focus direction shift in accordance with one embodiment of the present invention.

An example of an OPC shifted (defocused) paired line shortening array 800 is illustrated in FIG. 8A. The defocused array 800 appears as it would on a reticle. The OPC techniques such as have been described earlier are applied to the test structure on the reticle so that the test structure, i.e. the dual toned line shortening array, prints on the wafer identically as it would if the exposure was taken out of focus. The shapes 802, 803 may, for example, be configured with elongation features 808 so that the test structure primary features such as shapes 803 present more pullback to process changes (i.e., present higher sensitivity) and additionally print in a defocused state. The spaces 804, 805 may be configured with desensitizing scatter bars 806 to make the primary test structure features 802 less sensitive to process changes. As illustrated in FIG. 8B, the plot of the optically measured critical dimensions show a response centered at + or −0.2 micron for the defocused test structure (relative to a test structure where the OPC features have been symmetrically applied to make each portion of the array equally sensitive). In this embodiment, the OPC techniques are applied to the test structure to result in the printing of the test structure out of focus. This technique permits the test structure at best focus to be printed in the same exposure field as one or more test structures printed at the best focus. This technique avoids the yield wasting technique described in the prior art of printing the test structures in additional exposure fields by intentionally printing them out of focus. The direction of focus shift may be determined by evaluating the optical critical dimensions determined from the standard (at best focus) target structure with the optical critical dimensions of one or more defocused target structures. For example, FIG. 8C illustrates a sample determination of the direction of focus shift using a test structure printed at best focus and one printed in a defocused state (at +0.2 micron). The focus response curve 830 for the standard target structure 830 is shown centered about a best focus position (0 microns). An example CD measurement of A would suggest that the process had shifted in focus to a defocused state of + or −0.10 micron, corresponding respectively to points 834 and 835. The focus response curve 836 for the defocused test structure is shown centered at +0.2 micron. An example CD measurement at B for the same process condition would suggest that the process and shifted in focus to either 0.10 or 0.30 microns, corresponding respectively to points 838 and 839. Thus the two plots indicate that the shift in focus is in a positive direction, enabling both the direction and magnitude of the focus shift to be determined. As described above, the shift in the process window may be determined by mathematical modeling using the target structure critical dimension measurements and correlated values from the focus exposure matrix in the calibration phase.

These highly asymmetric dual tone line shortening arrays are created using OPC corrections to modify the target patterns. As a result, the dual tone arrays have an effective best focus position that is shifted relative to conventional dual toned line shortening arrays. According to the techniques described above with respect to OPC features used with the target structure, the CD measurements from the defocused array (created using asymmetric OPC features) may be used in conjunction with the CD measurements from the standard target structure (i.e., at best focus) to determine the drift in focus. The OPC features such as scatter bars 806 and elongation features 808, when placed adjacent to primary test pattern features 802, 803, 804, and 805 of the array 800, produce different sensitivities to process window changes and an asymmetric response when printed on the wafer. Thus, the OPC features may be designed so that the printed test structure appearing on the printed wafer is in a defocused state. The amount of defocusing desirable may be experimentally determined. Suitable results have been obtained with defocusing in the range of 0.10 to 0.20 micron. The optical response of the test structures may then be used to determine the direction of focus shift as described above. The resulting OPC corrected asymmetrical test structure gives the appearance of printing out of focus. The use of binary OPC changes in an asymmetric manner on the test structure generates a defocused printed test structure at a low cost and avoids the wasted exposure field(s) required when printing multiple exposures for test structures.

Figure 9:
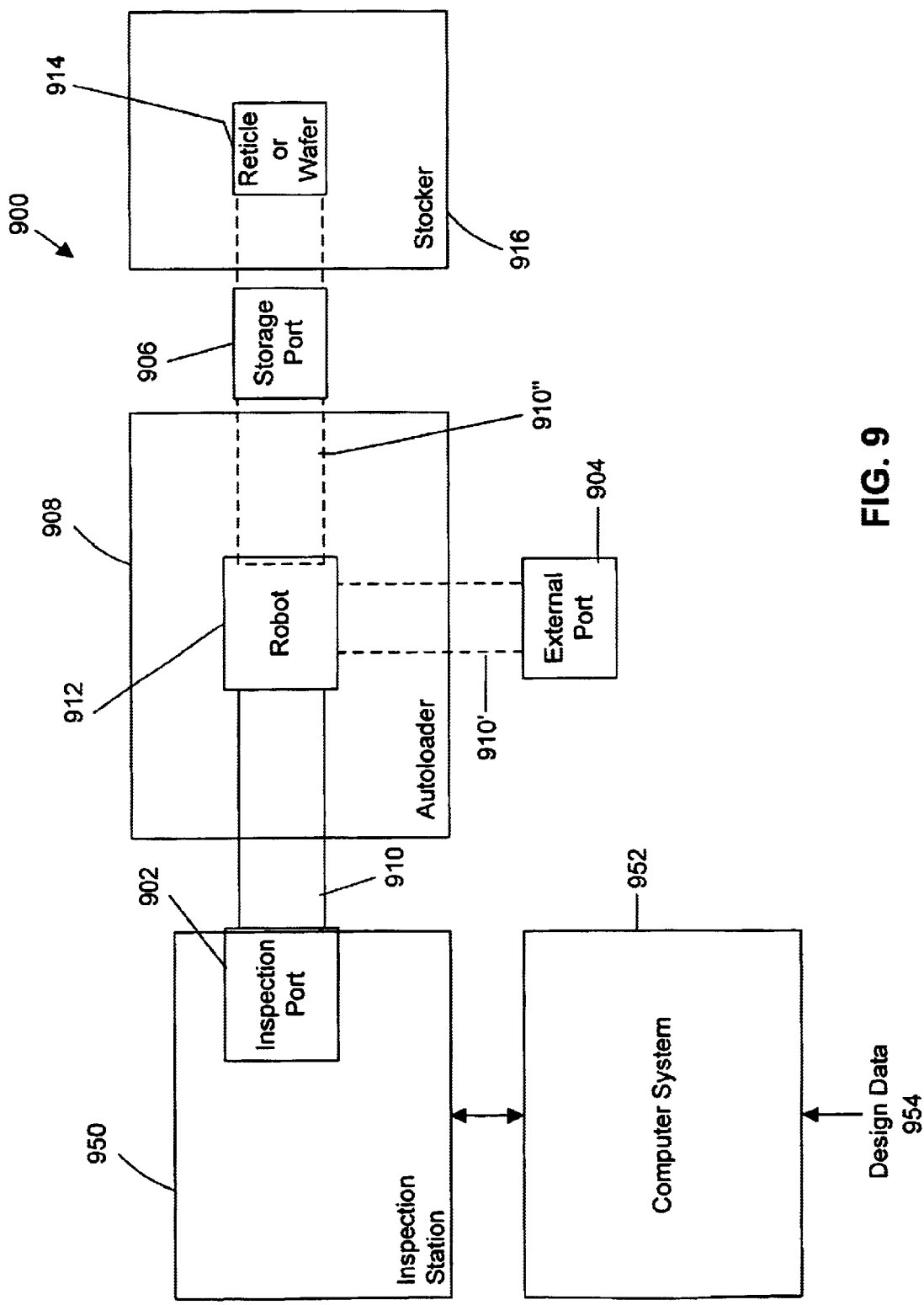
FIG. 9 illustrates an optical wafer inspection system used for detecting process changes in accordance with one embodiment of the present invention.

The invention may be used with any suitable inspection system. FIG. 9 shows a wafer or reticle inspection system 900 measuring the wafer as implemented in one embodiment of the present invention. An autoloader 908 for automatically transporting wafers includes a robot 912 having an arm 910 extending towards an inspection port 902 of a wafer inspection station 950. Arm 910 may rotate and extend towards an external port 904 when in its state denoted by reference number 910'. Similarly, when in its state denoted by reference number 910", the robotic arm can also extend towards a storage port 906 of a wafer stocker station 916 that typically includes several slots or tracks for storing wafers. The robotic arm is designed to further extend and retrieve a wafer 914 from wafer stocker station 916.

A typical inspection process, according to one embodiment of the present invention, may begin after wafer or reticle 914 is placed on external port 904, with the intention of storing the wafer in wafer stocker station 916 until it is used in a subsequent inspection application, for example. Robotic arm in its position 910' transports the wafer from external port 904 and stores it in a loading port of wafer stocker station 916 by extending as shown in FIG. 9. When the wafer is needed, for example, robotic arm 910" retrieves wafer 914 from the loading port and places it on inspection port 902 of wafer inspection station.

The wafer inspection station 950 is coupled with a computer system 952 where optical measurements are evaluated in comparison to measurements obtained form test structures and patterns from exposed fields on reference wafers. The wafer or reticle inspection system may also be used to detect defects. The computer system 952 may be integral to wafer inspection station 950 or separate from the inspection station 950. The wafer inspection station 950 receives design data 954 in the form of a list of figures, for example, in order to detect defects. Additionally, the computer system 952 receives image data (i.e., a test image) from the inspection station 950. The image data is analyzed by comparing it to a baseline image, which may be generated from the design data 954 or from the wafer 914. After the wafer inspection has concluded, wafer 914 is placed on external port 904. For lithographic monitoring and control, optical measurements from test structures on the wafer and obtained from inspection station 950 may be compared with measurements of test structures and patterns obtained in various exposure fields of a test wafer, such as used and described with reference to FIG. 5. The test wafer data may be stored and evaluated by computer system 952.

Suitable computer systems for use in implementing and controlling the methods in the present invention (e.g., controlling the settings of the various scanning apparatus components, storing and retrieving a baseline image of the wafer, storing a test image of the wafer, comparing the test image with one or more baseline images, storing the line-shortening measurements and statistical information during such comparisons, etc.) may be obtained from various vendors (e.g., Silicon Graphics of Mountain View, Calif. or Sun Microsystems of Sunnyvale, Calif.) or custom built by a wafer inspection system vendor, such as KLA-Tencor.

The term "electronic representation" as used herein covers any machine readable representation. Typically, such representations are stored on magnetic, electronic, or optically readable media. The content of such representations may be transmitted as electrical signals, magnetic signals, electromagnetic signals, optical signals, etc.

Preferably, an optical or other inspection system is integrated with a computer system which implements many of the method steps of this invention. Such composite system preferably includes at least (a) a baseline image (preferably compacted) stored in memory, (b) an imaging system arranged to generate an optical image of the wafer, and (c) a processing unit configured to compare the baseline and current test images and thereby identify defects, as well as compute according to the mathematical models described herein focus and exposure responses corresponding to optical measurements as well as store various statistical information. At a minimum, the imaging system will usually include (i) a source of illumination oriented to direct radiation onto a specified location of the wafer; and (ii) one or more detectors oriented to detect an image of the wafer from the source which has been scattered by the wafer. The imaging system may also include a scanning means.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, the subresolution features may be any feature which produces optical proximity correction effects on the printing of lines or patterns on a wafer. Additionally, the present invention may be especially useful in inspecting thin finished wafers to demonstrate compliance with critical dimensions and the measures of the critical dimensions. Accordingly, the present embodiments are to be considered as illustrative and not restrictive, and the invention is not to be limited to the details given herein, but may be modified within the scope and equivalents of the appended claims.

What is claimed is:

1. A method for controlling semiconductor lithographic process parameters comprising:

forming a test structure on a reticle, the test structure having wavefront engineering features to modify the print transfer characteristics of the test structure;

transferring the test structure to a first wafer using the lithography process to form a wafer test structure; and measuring at least a portion of the wafer test structure and comparing it to a reference dimension to determine whether at least one lithographic process parameter has changed and to provide an indirect measure of the change in the at least one lithographic process parameter.

2. A method as recited in claim 1, wherein the reference dimension is obtained from a second formation of the wafer test structure on one of the first wafer or a second wafer.

3. The method recited in claim 1 further comprising adjusting the at least one lithographic process parameter when the lithographic process has changed.

4. The method recited in claim 1 wherein the design of the wavefront engineering features is selected to result in an optimal sensitivity of the wafer test structure to a change in the at least one lithographic process parameter.

5. The method recited in claim 1, further comprising determining the design of the wavefront engineering feature by experimental means.

6. The method recited in claim 1 further comprising determining design of the wavefront engineering feature by a simulation run on a simulation tool.

7. The method recited in claim 2 wherein an optical overlay tool is used to measure the test structure in at least one of the first and second formations of the wafer test structure.

8. The method recited in claim 1 wherein the design of the wavefront engineering feature is selected so that the test structure is sensitive to changes in focus and exposure of an exposure tool used to form the wafer test structure.

9. The method recited in claim 2 wherein the wafer test structure is analyzed using image processing software.

10. The method recited in claim 1 wherein the wavefront engineering feature is a phase shift mask design.

11. The method recited in claim 1 wherein the wavefront engineering feature is an optical proximity correction.

12. The method recited in claim 1 wherein the test structure responds independently to focus and exposure variations.

13. The method recited in claim 1 further comprising adjusting the lithographic process parameter when the measured portion exceeds the reference dimension by a predetermined threshold.

14. The method recited in claim 1 wherein the wavefront engineering feature is configured to produce a predetermined change in the wafer test structure when the at least one lithography process parameter changes by a predetermined threshold.

* * * * *